(12) United States Patent
Wang et al.

(10) Patent No.: US 6,169,028 B1
(45) Date of Patent: Jan. 2, 2001

(54) METHOD FABRICATING METAL INTERCONNECTED STRUCTURE

(75) Inventors: Kun-Chih Wang, Tao-Yuan Hsien; Ming-Sheng Yang; Wen-Yi Hsieh, both of Hsinchu, all of (TW)

(73) Assignee: United Microelectronics Corp. (TW)

( * ) Notice: Under 35 U.S.C. 154(b), the term of this patent shall be extended for 0 days.

(21) Appl. No.: 09/237,787

(22) Filed: Jan. 26, 1999

(51) Int. Cl.[7] ................................................ H10L 21/44
(52) U.S. Cl. .......................................... 438/653; 438/653
(58) Field of Search .................................. 438/627, 643, 438/644, 653, 637, 672, 675, 638, 639, 674

(56) References Cited

U.S. PATENT DOCUMENTS

| | | | |
|---|---|---|---|
| 5,604,156 | * 2/1997 | Chung et al. | 438/626 |
| 5,814,557 | * 9/1999 | Venkatraman et al. | 438/622 |
| 5,969,422 | * 10/1999 | Ting et al. | 438/687 |
| 6,001,730 | * 12/1999 | Farkas et al. | 438/627 |

* cited by examiner

Primary Examiner—David Nelms
Assistant Examiner—Dung Ang Le
(74) Attorney, Agent, or Firm—Blakely Sokoloff Taylor & Zafman

(57) ABSTRACT

A method for fabricating a metal interconnect structure. A semiconductor substrate comprising a conductive layer therein is provided. A dielectric layer is formed on the semiconductor substrate. A part of the dielectric layer is removed to form a dual damascene opening and a trench therein, wherein the dual damascene opening exposes the conductive layer. The trench is larger than the dual damascene opening. A conformal barrier layer is formed on the dielectric layer. A conformal metal layer is formed on the barrier layer to fill the dual damascene opening and to partially fill the trench. The metal layer positioned in the trench has a thickness equal to the depth of the trench. A conformal cap layer is formed on the metal layer. A CMP process is performed to remove the cap layer, the metal layer and the barrier layer outside the trench and outside the dual damascene opening.

18 Claims, 3 Drawing Sheets

METHOD FABRICATING METAL INTERCONNECTED STRUCTURE

BACKGROUND OF THE INVENTION

1. Field of the Invention

The invention relates in general to a semiconductor fabrication method, and more particularly to fabrication of a metal interconnect in which a chemical mechanical polishing (CMP) technique, customarily referred to as Cu-CMP, is required to polish a copper-based metallization layer to form the interconnect.

2. Description of the Related Art

High-density integrated circuits, such as very large scale integration (VLSI) ICs, are typically formed with a multi-level interconnect structure including two or more levels of metal-interconnect structures that serve as wiring line structures for electrically interconnecting the various components in the integrated circuits. A multi level interconnect structure includes a first layer (base layer) of metal-interconnect structure which is electrically connected to the source/drain regions of the MOS transistors formed in the integrated circuit, and at least a second layer of metal-interconnect structure which is separated from the base layer of metal-interconnect structure by an insulating layer, with the second layer of a metal-interconnect structure being electrically connected to the base layer of a metal-interconnect structure via metal plug (also called a via) formed in the insulating layer. Still another or several more layers of metal layers of metal-interconnect structures can be formed over the second layer of the metal-interconnect structure to constitute the multi-level interconnect structure.

One drawback to the conventional multi-level interconnect structure, however, is that when the IC device is further scaled down, the structure causes an increase in the capacitive effect between neighboring metal lines, thus increasing the resistance-capacitance (RC) delay and cross talk in the metal plugs. As a consequence, the transmission of the data through the metal lines in the metal-interconnect structures is slowed, thus degrading the performance of the IC device.

Copper, which has a low electrical resistance, is presently being experimented with in metal-interconnect structure formation in integrated circuits to provide increased conductivity to the data transmission lines in the integrated circuit. A conventional process for fabricating a metal-interconnect structure is depicted in the following with reference to FIGS. 1A–1C.

Referring to FIG. 1A, a semiconductor substrate 10 is provided. The substrate 10 includes a conductive layer, such as a source/drain region or other conductive elements. An intermetal dielectric layer 12 is formed on the substrate 10. A dual damascene opening 14, which comprises a via and a trench, is formed in the intermetal dielectric layer 12. Furthermore, a trench 16 is found in the intermetal dielectric layer 12. The trench 16 is larger than the dual damascene opening 14.

Referring to FIG. 1B, a conformal tantalum nitride layer 18 is formed on the intermetal dielectric layer 12 to partially fill the dual damascene opening 14 and the large trench 16. A copper layer 20 is formed on the tantalum nitride layer 18 and overflows the dual damascene opening 14 and the large trench 16. The tantalum nitride layer 18 is used to enhance the adhesion between the copper layer 20 and the intermetal dielectric layer 12.

Referring to FIG. 1C, a chemical mechanical polishing process is performed to form a dual damascene 20a and the copper plug 20b in the trench 16. The tantalum layer 18 is harder than the copper layer 20. A part of the copper layer 20 positioned in the trench 16 exposes a larger area than other regions so that the top surface of the copper plug 20b has a dishing shape as shown in figure. The dishing shape makes the overall top surface of the wafer highly non-planar, and therefore may cause the subsequently deposited insulating oxide layers to be poor in planarization. This may cause erosion to the oxide layers, resulting in an increase in the resistance of the metal-interconnect structure, thus degrading the performance of the resultant IC device.

One conventional solution to the forgoing problem is to use multiple polishing steps with various kinds of slurry and different polish pads to reduce the undesired high CMP selectivity between the copper-based metal-interconnect structure and the barrier layer. However, this practice will significantly increase the number of reworks of the CMP process, making the overall process very complex and thus costly to implement.

SUMMARY OF THE INVENTION

It is therefore an object of the invention to provide a method for fabricating a metal interconnect structure in an integrated circuit, which can be utilized in the fabrication of a copper-based interconnect structure to prevent the undesired dishing of the copper-based interconnect structure due to high CMP selectivity between copper and the barrier layer, so as to make the copper-based interconnect structure high in resistance and planarization.

The invention achieves the above-identified objects by providing a method for fabricating a metal interconnect structure. A semiconductor substrate comprising a conductive layer therein is provided. A dielectric layer is formed on the semiconductor substrate. A part of the dielectric layer is removed to form a dual damascene opening and a trench therein, wherein the dual damascene opening exposes the conductive layer. The trench is larger than the dual damascene opening. A conformal barrier layer is formed on the dielectric layer. A conformal metal layer is formed on the barrier layer to fill the dual damascene opening and to partially fill the trench. The metal layer positioned in the trench has a thickness equal to the depth of the trench. A conformal cap layer is formed on the metal layer. A CMP process is performed to remove the cap layer, the metal layer and the barrier layer out from the trench and out from the dual damascene opening.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
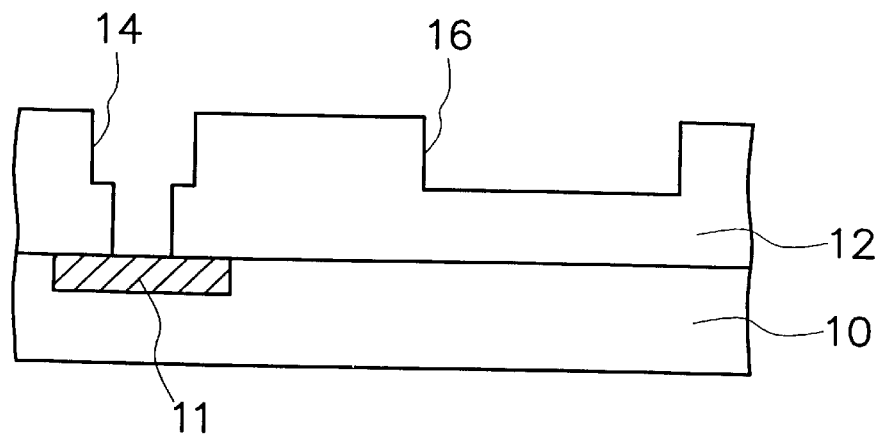
FIGS. 1A to 1C are schematic, cross-sectional views showing a conventional process for fabricating a metal-interconnect structure.
Figure 1B:
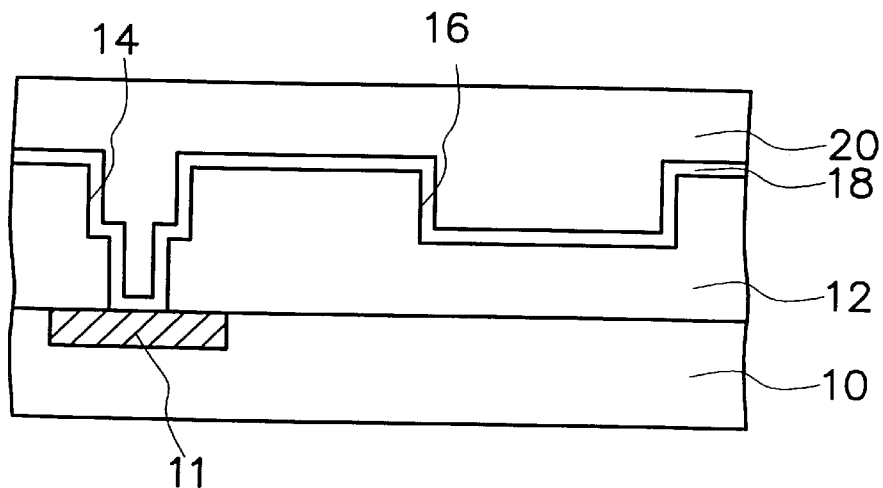
Figure 1C:
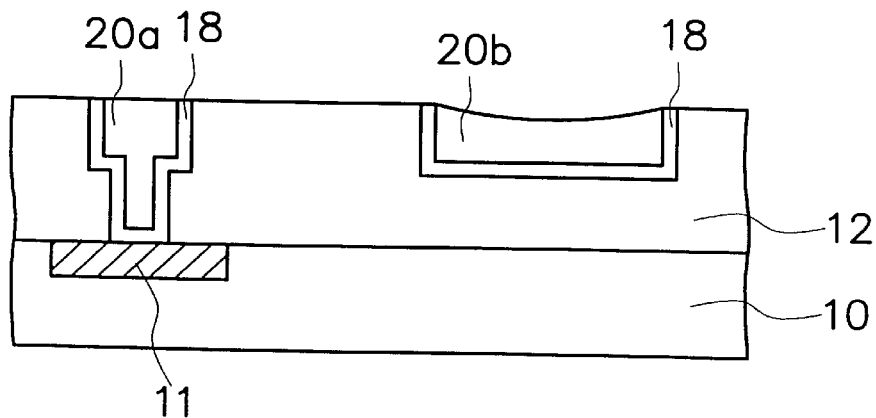
Figure 2A:
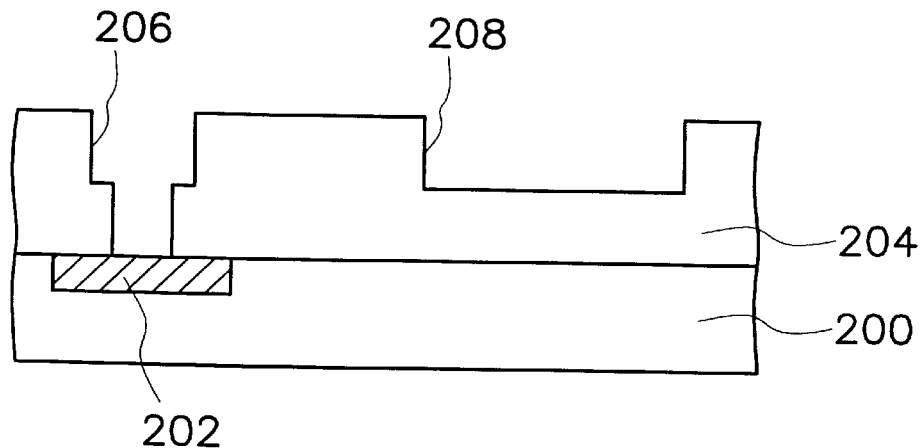
FIGS. 2A to 2E are schematic, cross-sectional views showing the process steps of one preferred embodiment of the method for fabricating a metal-interconnect structure.

In FIG. 2A, a semiconductor substrate 200 is provided. A conductive layer 202, such as the gate of a transistor, source/drain region or other metal interconnect, is formed in the semiconductor substrate 200. A dielectric layer 204, such as silicon oxide, is formed on the semiconductor substrate 200 by, for example, chemical vapor deposition (CVD). A photolithography and etching process is performed to form a dual damascene opening 206, which comprises a trench and a via, to expose the conductive layer 202 and to form a trench 208 in the dielectric layer 204. The size of the trench 208 is larger than the size of the dual damascene opening. The trench 208 also can be used as the trench of a dual damascene structure.

Figure 2B:
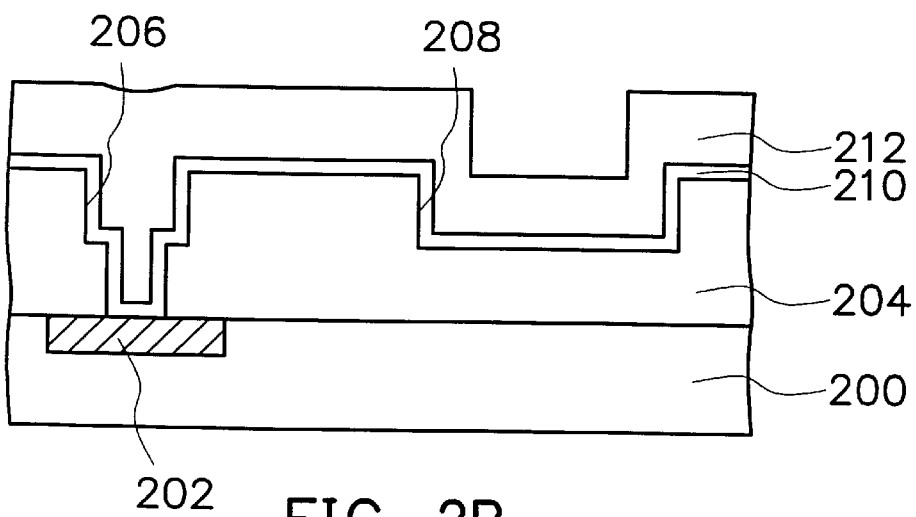

In FIG. 2B, a conformal barrier layer 210 is formed on the dielectric layer 204. A conformal metal layer 212, such as copper, is formed on the barrier layer 210. The thickness of the metal layer 212 depends on the depth of the trench 208. The top surface of the metal layer 212 formed within the trench and the top surface of the dielectric layer 204 have the same level. Since the dual damascene opening 206 is smaller than the trench 208, the metal layer 212 completely fills the dual damascene opening 206. The preferred material of the first metal layer 210 comprises copper which is formed by electrode-plating, chemical vapor deposition (CVD), electrodeless-Cu technology or electrodeless-plating. For example, electrodeless-Cu technology has a bottom-up effect so that the metal layer 212 fills the dual damascene opening 206 and partially fills the trench 208.

Figure 2C:
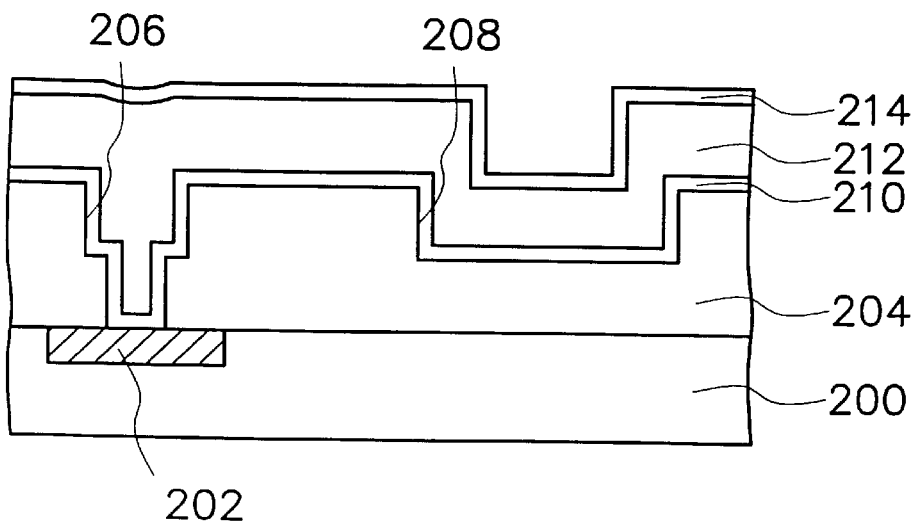

In FIG. 2C, a cap layer 214 with a thickness of about 300–1000 Å is formed on the metal layer 212. Preferred materials for the cap layer 214 includes tantalum nitride, silicon oxide and silicon nitride.

Figure 2D:
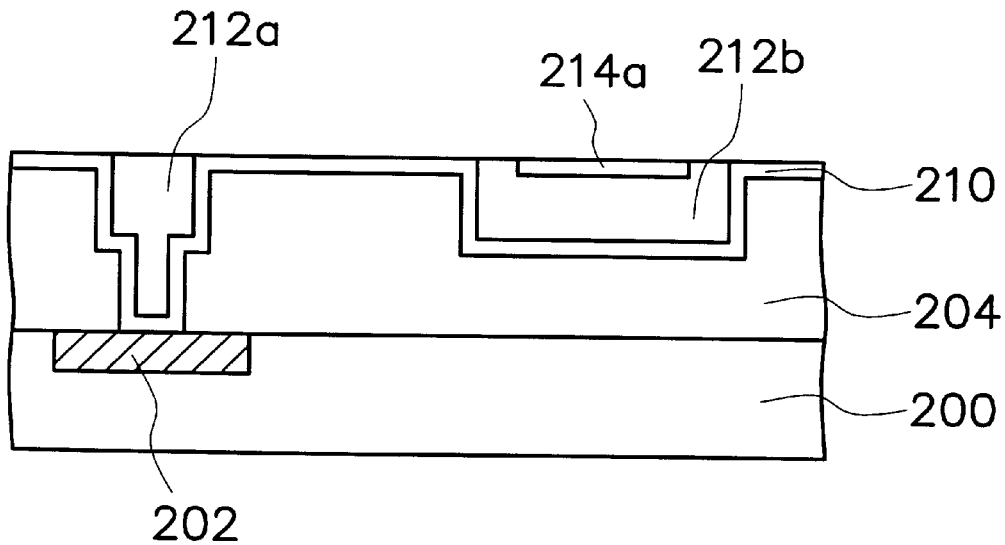

In FIG. 2D, a CMP process is performed to removed a part of the cap layer 214 and a part of the metal layer 212. The cap layer 214 has a high-step profile at the edge of the trench 208 so that a part of the cap layer 214 outside the trench 208 is first polished.

Figure 2E:
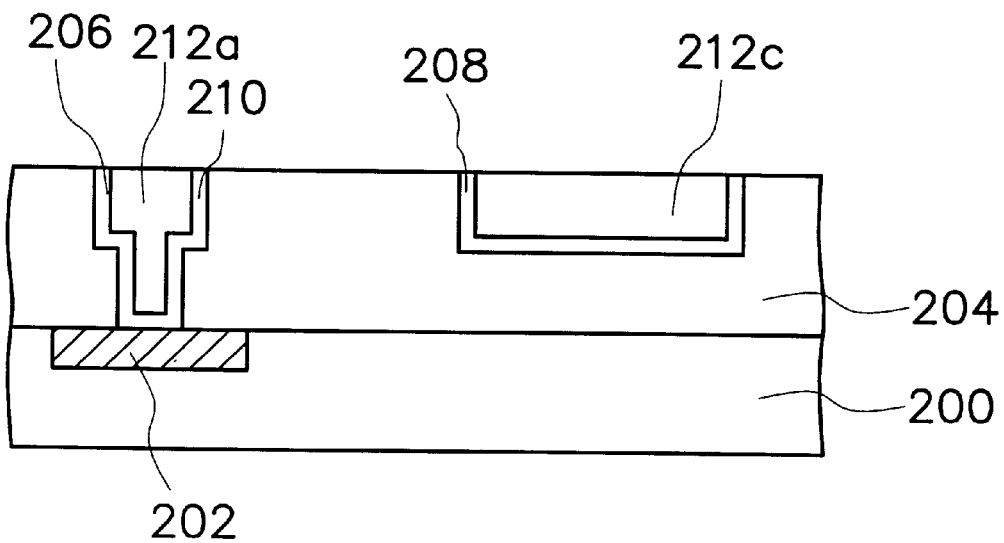

A part of the cap layer 214a remains on the metal layer 212b positioned within the trench 208, until the barrier layer 210 is exposed. The barrier layer 210 and the cap layer 214 have same selectivity for CMP so that the remaining cap layer 214a is used as a protective layer to prevent dishing of the metal layer 212b due to being easily polished. The CMP process is continually performed until the barrier layer 210 outside the trench 208 and the remaining cap layer 214a are removed. The metal interconnect structure is shown in FIG. 2E, wherein a dual damascene 212a electrically couples with the conductive layer 202 and a metal plug 212c fills in the trench 208.

In the invention, a cap layer is provided on a metal layer with a large area to prevent dishing of the metal layer while performing a CMP process. The cap layer is harder than the metal layer. The polishing rate of the CMP process is slowed down while exposing the cap layer so that the dishing of the metal layer as seen in a conventional metal-interconnect structure is thus avoided.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a metal interconnect structure, comprising the steps of:
   providing a semiconductor substrate, wherein the semiconductor substrate comprises a conductive layer formed therein;
   forming a dielectric layer on the semiconductor substrate;
   removing a part of the dielectric layer to form a dual damascene opening exposing the conductive layer and to form a trench in the dielectric layer;
   forming a conformal barrier layer on the dielectric layer;
   forming a copper layer on the barrier layer, wherein a part of the copper layer positioned in the trench has a thickness equal to a depth of the trench;
   forming a cap layer on the copper layer;
   removing a part of the cap layer and a part of the copper layer until the barrier layer is exposed; and
   removing a part of the copper layer, the exposed barrier layer, and a remaining part of the cap layer that are outside the trench and the dual damascene opening, so that the dielectric layer is exposed.

2. The method according to claim 1, wherein the cap layer has a thickness of about 300–1000 Å.

3. The method according to claim 1, wherein a material of the cap layer is selected from a group consisting of silicon oxide, silicon nitride and tantalum nitride.

4. The method according to claim 1, wherein the step of forming the copper layer includes electrode-plating.

5. The method according to claim 1, wherein the step of forming the copper layer includes chemical vapor deposition.

6. The method according to claim 1, wherein the step of forming the copper layer includes electrodeless-Cu technology.

7. The method according to claim 1, wherein the step of forming the copper layer includes electrodeless-plating.

8. The method according to claim 1, wherein a material of the barrier layer is selected from a group comprising tantalum, tantalum nitride and other refractory metals.

9. A method for fabricating a metal interconnect structure, comprising the steps of:
   providing a dielectric layer, wherein the dielectric layer has a trench therein;
   forming a conformal barrier layer on the dielectric layer;
   forming a metal layer on the barrier layer, wherein a part of the metal layer positioned in the trench has a thickness equal to a depth of the trench;
   forming a conformal cap layer on the metal layer; and
   removing a part of the metal layer, a part of the barrier, and a part of the cap layer that are outside the trench.

10. The method according to claim 9, wherein the cap layer has a thickness of about 300–1000 Å.

11. The method according to claim 9, wherein a material of the cap layer is selected from a group consisting of silicon oxide, silicon nitride and tantalum nitride.

12. The method according to claim 9, wherein the metal layer comprises metals with an electrical resistance comparable to copper.

13. The method according to claim 9, wherein the metal layer comprises a copper layer.

14. The method according to claim 13, wherein the method of forming the copper layer includes electrode-plating.

15. The method according to claim 13, wherein the method of forming the copper layer includes chemical vapor deposition.

16. The method according to claim 13, wherein the method of forming the copper layer includes electrodeless-Cu technology.

17. The method according to claim 13, wherein the method of forming the copper layer includes electrodeless-plating.

18. The method according to claim 9, wherein a material of the barrier layer is selected from a group comprising tantalum, tantalum nitride and other refractory metals.

* * * * *

UNITED STATES PATENT AND TRADEMARK OFFICE
CERTIFICATE OF CORRECTION

PATENT NO. : 6,169,028 B1                                                              Page 1 of 1
DATED : January 2, 2001
INVENTOR(S) : Wang et al.

It is certified that error appears in the above-identified patent and that said Letters Patent is hereby corrected as shown below:

<u>Title page,</u>
Item [54], Title, please delete "METHOD FABRICATING" and insert
-- METHOD FOR FABRICATING --

Signed and Sealed this

First Day of January, 2002

Attest:

Attesting Officer

JAMES E. ROGAN
Director of the United States Patent and Trademark Office